United States Patent
Lin et al.

(10) Patent No.: US 6,900,112 B2
(45) Date of Patent: May 31, 2005

(54) PROCESS FOR FORMING SHALLOW TRENCH ISOLATION REGION WITH CORNER PROTECTION LAYER

(75) Inventors: Chi-Hui Lin, Taipei (TW); Chung-Lin Huang, Taichung (TW)

(73) Assignee: Nanya Technology Corporation, Taoyuan (TW)

(*) Notice: Subject to any disclaimer, the term of this patent is extended or adjusted under 35 U.S.C. 154(b) by 209 days.

(21) Appl. No.: 10/426,348

(22) Filed: Apr. 30, 2003

(65) Prior Publication Data
US 2004/0077176 A1 Apr. 22, 2004

(51) Int. Cl.$^7$ .............................................. H01L 21/76

(52) U.S. Cl. ...................... 438/424; 438/435; 438/690; 438/691

(58) Field of Search ................................ 438/294–296, 438/221, 391, 424–428, 690–693

(56) References Cited

U.S. PATENT DOCUMENTS

| | | | | |
|---|---|---|---|---|
| 5,863,827 A | * | 1/1999 | Joyner | 438/425 |
| 5,940,716 A | * | 8/1999 | Jin et al. | 438/424 |
| 6,358,818 B1 | * | 3/2002 | Wu | 438/431 |
| 6,518,145 B1 | * | 2/2003 | Alsmeier et al. | 438/425 |
| 6,518,148 B1 | * | 2/2003 | Cheng et al. | 438/437 |

* cited by examiner

Primary Examiner—Duy-Vu N. Deo
(74) Attorney, Agent, or Firm—Quintero Law Office

(57) ABSTRACT

A process for forming shallow trench isolation region with corner protection layer. A protection layer is formed within the opening that defines the isolation trench as part of the etching mask such that the etching rate of the protection layer is less than the mask layer and the pad insulating layer to the etchant used to remove the mask layer and pad insulating layer. The protection layer is partially removed and left adjacent to the shallow trench isolation region as a corner protection layer after removing the mask layer and pad insulating layer. Thus, the indentation next to the corner of the isolation region is avoided.

15 Claims, 4 Drawing Sheets

PROCESS FOR FORMING SHALLOW TRENCH ISOLATION REGION WITH CORNER PROTECTION LAYER

BACKGROUND OF THE INVENTION

1. Field of the Invention

The present invention relates to a method of protecting the corner of a shallow trench isolation region and more particularly to a process for forming shallow trench isolation region with corner protection layer.

2. Description of the Related Art

Recently, as the manufacturing techniques of semiconductor integrated circuits develop, the number of devices in a chip was increased. The size of the device decreases as the degree of integration increases. The line width used in manufacturing lines has decreased from sub-micron to quarter-micron, or even smaller. Regardless of the reduction of the size of the device, adequate insulation or isolation must be formed among individual devices in the chip so that good element characteristics can be achieved. This technique is called device isolation technology. The main object is to form an isolation region, reducing the size of the isolation as much as possible while assuring good isolation effect to allow larger chip space for more devices.

Among different device isolation techniques, LOCOS and shallow trench isolation region manufacturing methods are the two most used methods. In particular, as the latter has a small isolation region and can keep the substrate level after the process is finished, it is the semiconductor manufacturing method obtaining the most attention.

The conventional manufacturing process for shallow trench isolation region is shown in the cross sections of FIG. 1A to 1D.

In FIG. 1A, a pad oxide layer 12 is formed on a silicon substrate 10 using thermal oxidation and a silicon nitride layer 14 is deposited on the pad oxide layer 12 using CVD. Next, a photoresist layer 16 is coated on the silicon nitride layer 14 and is patterned using photolithography to expose the portion where the device isolation region is to be formed. Silicon nitride layer 14 and pad oxide layer 12 are etched sequentially using the photoresist layer 16 as a mask.

In FIG. 1B, after photoresist layer 16 is removed with adequate solution, and silicon nitride layer 14 and pad oxide layer 12 are used as a mask to etch silicon substrate 10 to form a trench 20 inside, thereby defining the active region of the device. Subsequently, thermal oxidation is performed to grow a thin silicon oxide layer as the lining oxide layer 24 on the bottom and sidewall of the trench 20. However, when silicon dioxide is formed, the stress is concentrated on the curvature region of a smaller radius, and the corner 22 of trench 20 is a sharp curvature of small radius, the growth rate of the silicon dioxide at the corner 22 of the trench 20 is slower, so that the lining oxide layer 24 at the corner 22 of the trench 20 is very thin.

Next, chemical vapor deposition is performed, for example using $O_3$ and TEOS as a reactant to form oxide layer 26, filling the trench 20 and covering the surface of the silicon nitride layer 14.

In FIG. 1C, chemical mechanical polishing (CMP) is then performed, wherein the part of oxide layer 26 higher than the surface of the silicon nitride layer 14 is removed to form the shallow trench isolation region 26a with a level surface. Subsequently, a suitable etching method is used to remove the silicon nitride layer 14 and pad oxide layer 12 in order to complete shallow trench isolation, and the structure shown in FIG. 1D is obtained.

Because the properties of the shallow trench isolation region 26a are similar to those of the pad oxide layer 12, when etchant is used to dip pad oxide layer 12, the shallow trench isolation region 26a is inevitably etched so that the corner 22 of the trench 20 is exposed and an indentation 30 is formed adjacent to the corner 22 of the trench 20.

Thus, when the gate oxide layer and gate conductive layer are formed later, the conductive layer deposited in the indentation 30 is not easily removed and a short circuit between the adjacent transistors is easily formed. In addition, since the gate oxide layer at the corner 22 of the trench 20 is thinner than other places, a parasitic transistor is then formed. This phenomenon is equivalent to two transistors with gate oxide layers of different thickness in parallel. When current goes through this parasitic transistor, as the curvature radius of the corner 22 of the trench 20 is small, the electric fields concentrate and the Fowler-Nordheim current increases, hence the insulating property of the gate oxide layer of the corner 22 degrades, resulting in abnormal element characteristics. For example, there is a kink effect in I–V curvature of $I_d$ and $V_g$, which generates a double hump.

SUMMARY OF THE INVENTION

Accordingly, an object of the invention is to provide a process for forming shallow trench isolation region with corner protection layer to avoid indentation adjacent to the corner of the isolation region.

Furthermore, the present invention provides a process that avoids a trench isolation region of parasitic transistors formed at the corner of the isolation region.

Furthermore, the present invention provides a process for forming a trench isolation region that avoids short circuit between adjacent transistors.

Hence, the process for forming shallow trench isolation with corner protection layer comprises sequentially forming a pad insulating layer and a mask layer on a semiconductor substrate, patterning the pad insulating layer and the mask layer to form an opening and exposing the semiconductor substrate therein, etching the pad insulating layer within the opening and removing part of the pad insulating layer from both sides within the opening, etching the mask layer and removing a predetermined width on both sides of the mask layer within the opening and forming a undercut area on both sides within the opening, forming a protection layer in the undercut area and on the sidewall of the mask layer within the opening, etching the semiconductor substrate using the patterned pad insulating layer and the mask layer and the protection layer as the etch mask to form a trench in the semiconductor substrate, forming a shallow trench isolation region in the trench and the opening; removing the mask layer and the protection layer adjacent to the sidewall of the mask layer, and removing the pad insulating layer, leaving part of the protection layer in the undercut areas as a corner protection layer of the shallow trench isolation region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 2A to 2D are cross sections of the manufacturing process of a shallow trench isolation region with corner protection layer in accordance with the present invention.

Figure 1B:
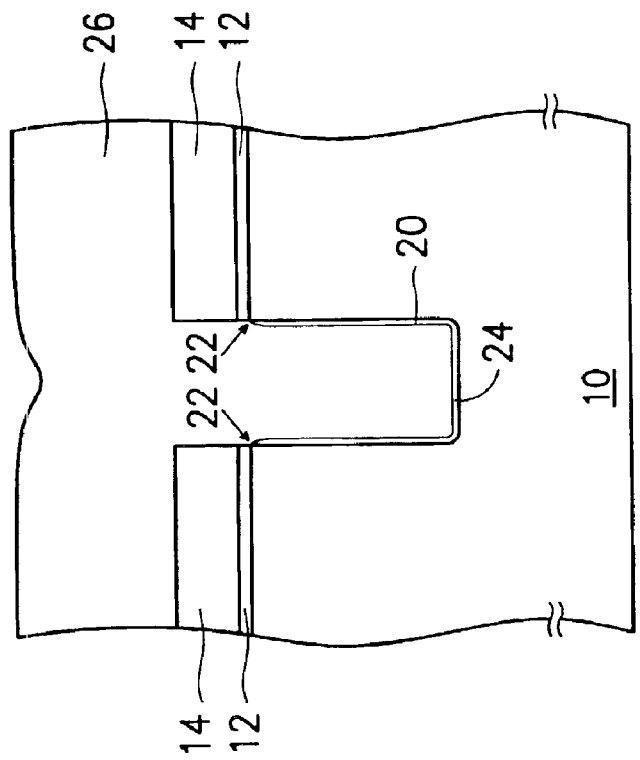
FIGS. 1A to 1D show cross sections of the manufacturing process of the conventional shallow trench isolation region.
Figure 1A:
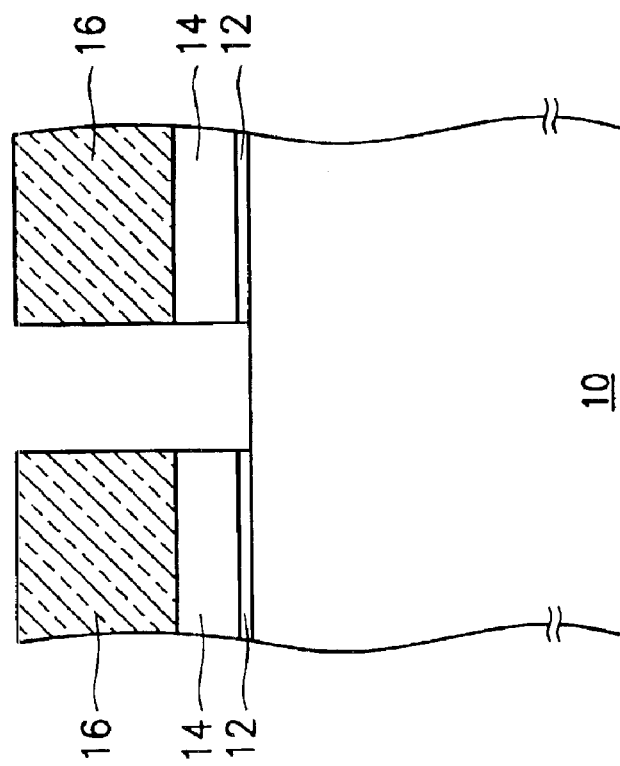
Figure 1D:
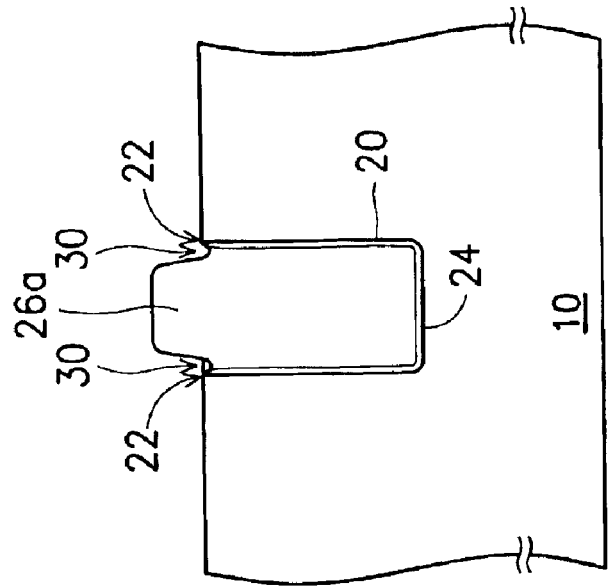
Figure 1C:
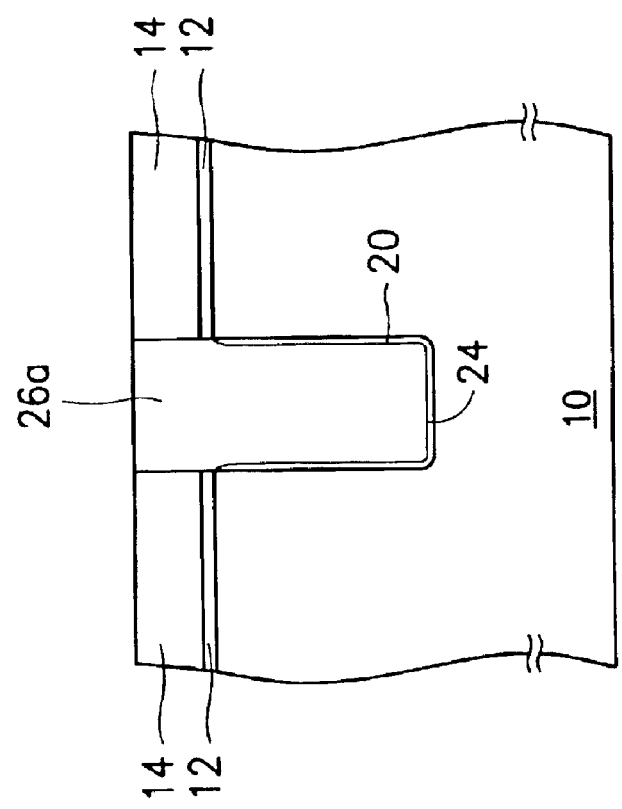
Figure 2B:
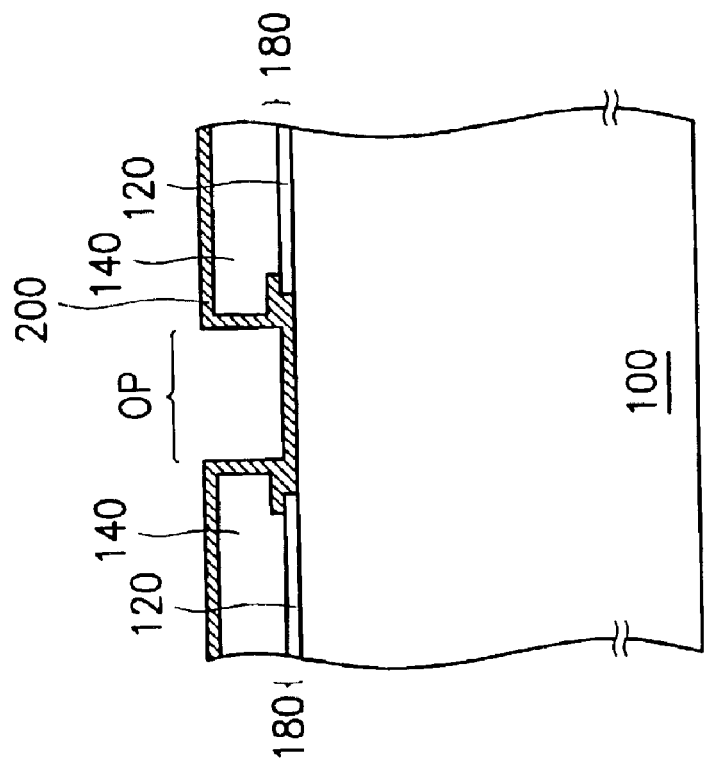
FIGS. 2A to 2D show cross sections of the manufacturing process of a shallow trench isolation region with corner protection layer in accordance with the present invention.
Figure 2A:
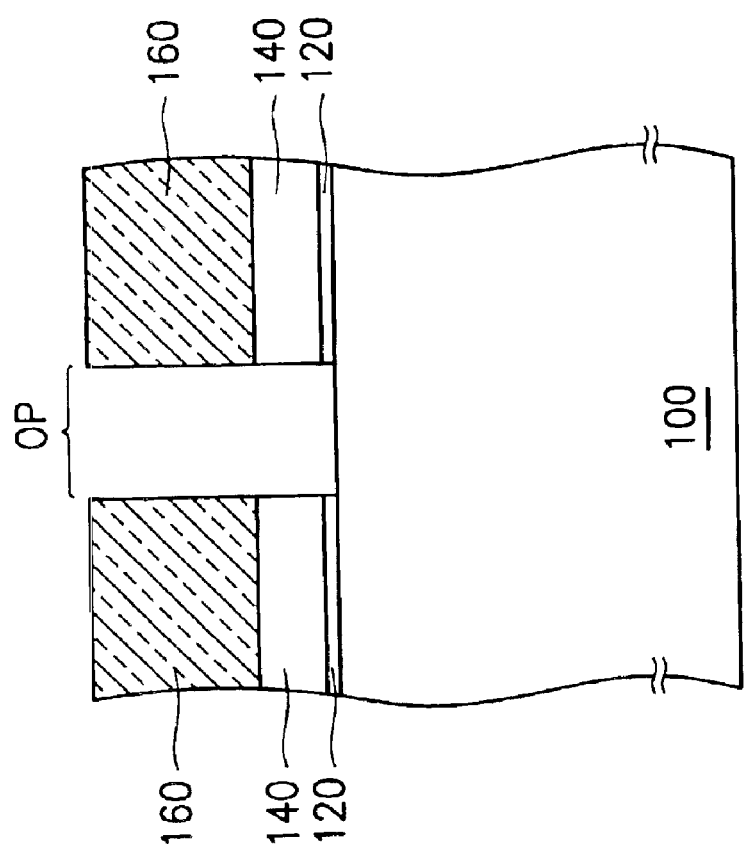

In FIG. 2A, a semiconductor substrate (for example silicon substrate) 100 is provided. A pad insulation layer (for example, pad oxide layer) 120 and a mask layer 140 are formed sequentially on the surface of the silicon substrate 100. The method of forming the pad oxide layer 120 is thermal oxidation or chemical vapor deposition, in which thermal oxidation is preferred. The mask layer 140 is silicon nitride, formed by, for example, chemical vapor deposition. Next, a photoresist layer 160 is coated on the surface of the mask layer 140, and photolithography is performed to define the photoresist pattern required. Next, the patterned photoresist layer 160 is used as a mask to anisotropically etch the mask layer 140 and the pad oxide layer 120, for example reactant ion etch process (RIE), to transfer the pattern of the photoresist layer 160 to mask layer 140 and the pad oxide layer 120 to form opening OP, such that the semiconductor substrate in the opening OP is exposed, and the size of the opening OP is substantially the size of the isolation region. Then, suitable solution or dry etch process is performed to remove photoresist layer 160.

In FIG. 2B, a wet treatment is then performed. The wet treatment includes using etchant, such as a solution of hydrofluoric acid ($HF_{(aq)}$), to etch both sides of the pad oxide layer 120 within the opening OP and part of the pad oxide layer 120 adjacent to the opening OP until a width between 250~350 Å is removed, then using etchant, such as a solution of hot phosphoric acid ($H_3PO_{4(aq)}$), to etch both sides of the mask layer 140 within the opening OP and part of the mask layer 140a adjacent to the opening OP with a width between 150~250 Å is removed and an undercut area 180 adjacent to both side of the mask layer 140 and the pad oxide layer 120 within the opening OP is formed. Next, a layer of protecting material 200, such as oxynitride, is deposited on the surface of the mask layer 140 and in the opening OP and fills the undercut area 180 within the opening OP using low pressure chemical vapor deposition (LPCVD).

Figure 2D:
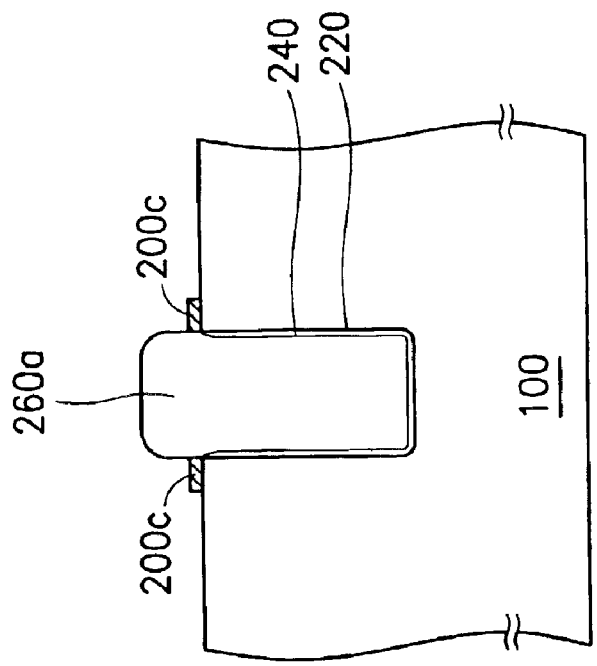
Figure 2C:
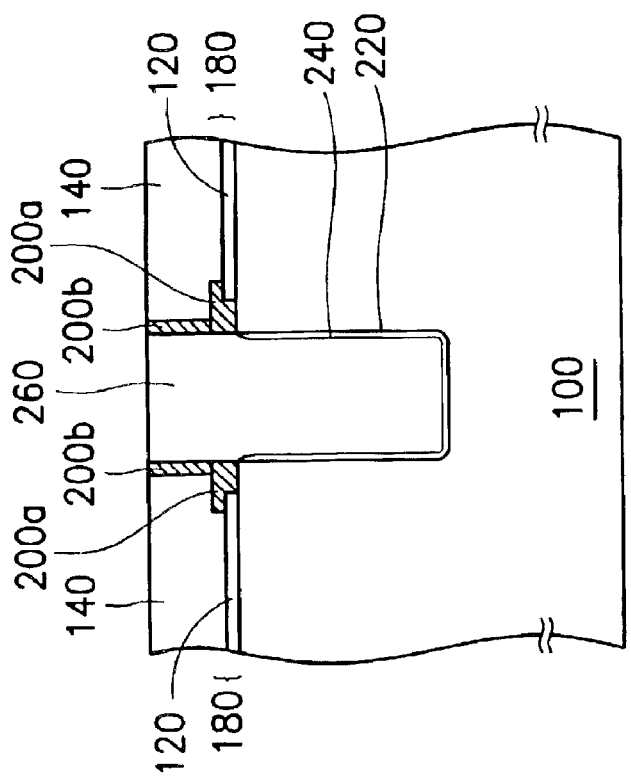

In FIG. 2C, the layer of protecting material 200 is then etched back. A protection layer composed of a horizontal protection layer 200a in the undercut area 180 and a vertical protection layer 200b on the sidewall of the mask layer 140 within the opening OP is formed. The thickness of the horizontal protection layer 200a is between 200~400 Å and the width of the vertical protection layer 200b is between 150~250 Å.

Next, an etching process is performed using the mask layer 140 and pad oxide layer 120 and the protection layer composed of the horizontal protection layer 200a and the vertical protection layer 200b as an etch mask, and the silicon substrate 100 is etched to a predetermined depth to form a trench 220 inside. Then a thermal oxidation process is performed to grow a thin oxide layer as a lining oxide layer 240 in the bottom and sidewall of the trench 220. An insulating layer 260 is then deposited on the surface of the mask layer 140 and is filled on the lining oxide layer 240 within the trench 220 and in the opening OP. The method for forming the insulating layer can be, for example, high density plasma chemical vapor deposition (HDP CVD). The insulating layer 260 is silicon dioxide. Next, CMP is performed to remove the part of the insulating layer 260 higher than the surface of the mask layer 140 and a shallow trench isolation region 260a is formed in trench 220 and opening OP as an isolation region between devices.

In FIG. 2D, the mask layer 140 and the pad oxide layer 120 are then removed sequentially using proper etching. The corner protection layer 200c left adjacent to both corners of the shallow trench isolation region 260a provides corner protection during the process of removing the mask layer 140 and the pad oxide layer 120 as mentioned and avoids indentation in the lining oxide layer 240 adjacent to the corner of the shallow trench isolation region 260a. Thus, a process for forming shallow trench isolation region with corner protection layer in accordance to the invention is completed and a structure of shallow trench isolation region shown in FIG. 2D is obtained.

It should be noted that, unlike the prior art, during the process of removing the mask layer 140 and the pad oxide layer 120, a shallow trench isolation region 260a with corner protection layer is formed. First, the wet etching for removing mask layer 140 uses etchant such as a hot solution of phosphoric acid ($H_3PO_{4(aq)}$). Here, the etching rate of the protection layer 200 (oxynitride) to the hot solution of phosphoric acid ($H_3PO_{4(aq)}$) is less than the etching rate of the mask layer 140 (silicon nitride) to the hot solution of phosphoric acid ($H_3PO_{4(aq)}$), so during the process of removing mask layer 140, the exposed vertical protection layer 200b adjacent to both side of the shallow trench isolation region 260a and part of the horizontal protection layer 200a in undercut area 180 are removed at the same time and part of the horizontal protection layer 200a is left.

Next, during the process of removing the pad oxide layer 120, the wet etching for removing pad oxide layer 120 uses etchant such as a solution of hydrofluoric acid ($HF_{(aq)}$). Here, the etching rate of the horizontal protection layer 200a (oxynitride) to the solution of hydrofluoric acid ($HF_{(aq)}$) is less than the etching rate of the pad oxide layer 120 (silicon dioxide) to the solution of hydrofluoric acid ($HF_{(aq)}$), so during the process of removing pad oxide layer 120, part of the horizontal protection layer 200a left adjacent to both side of the shallow trench isolation region 260a is also removed and subsequently a corner protection layer 200c is left adjacent to each side of the shallow trench isolation region 260a to protect both corners of the shallow trench isolation region 260a and avoid indentation in the lining oxide layer 240 adjacent to the shallow trench isolation region 260a etched by the etchant in the process of removing the pad oxide layer 120. Space blockages, such as indentation of the conducting material formed subsequent to the removing, will not occur and the thickness of the gate oxide layer subsequently formed is more even. Also, because the curvature radius of the the corner of the shallow trench isolation region 260a is protected, the electric fields are not concentrated in this region.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A process for forming shallow trench isolation region with corner protection layer, comprising:

forming a pad insulating layer and a mask layer on a semiconductor substrate sequentially;

patterning the pad insulating layer and the mask layer to form an opening and exposing the semiconductor substrate in the opening;

etching both sides of the pad insulating layer within the opening and removing part of the pad insulating layer adjacent to the opening;

etching both sides of the mask layer within the opening and removing a predetermined width of the mask layer and forming a undercut area in both sides of the opening;

forming a protection layer in the undercut area and on the sidewall of the mask layer within the opening;

etching the semiconductor substrate using the patterned pad insulating layer and the mask layer and the protection layer as the etch mask to form a trench in the semiconductor substrate;

forming a shallow trench isolation region in the trench and the opening;

removing the mask layer and the protection layer adjacent to the sidewall of the mask layer; and removing the pad insulating layer, leaving part of the protection layer in the undercut area as a corner protection layer of the shallow trench isolation region.

2. The process as claimed in claim 1, wherein forming a protection layer in the undercut area and on the sidewall of the mask layer within the opening further comprises:

depositing a layer of protecting material on the surface of the mask layer and in the opening and filling the undercut area; and etching back the protecting material to leave a protection layer covered on the sidewall of the mask layer and in the undercut areas within the opening.

3. The process as claimed in claim 1, wherein forming a shallow trench isolation region in the trench and the opening further comprises:

forming a lining oxide layer in the trench;

depositing an insulating layer on the mask layer and filling the trench and the opening; and performing a planarization process to remove the part of the insulating layer higher than the surface of the mask layer and forming an insulating layer in the trench and in the opening as a shallow trench isolation region to isolate devices.

4. The process as claimed in claim 3, wherein the lining oxide layer is grown by thermal oxidation.

5. The process as claimed in claim 1, wherein the pad insulating layer is silicon dioxide.

6. The process as claimed in claim 1, wherein the mask layer is silicon nitride.

7. The process as claimed in claim 1, wherein the predetermined width of the mask layer removed in the opening is between 150~250 Å.

8. The process as claimed in claim 1, wherein the protection layer is oxynitride.

9. The process as claimed in claim 2, wherein the method for depositing the layer of protecting material is LPCVD.

10. The process as claimed in claim 3, wherein the insulating layer is silicon dioxide.

11. The process as claimed in claim 3, wherein the method for depositing the insulating layer is HDP CVD.

12. The process as claimed in claim 1, wherein the method used for etching the pad insulating layer is wet etching.

13. The process as claimed in claim 12, wherein the etchant using in the wet etching is a solution of hydrofluoric acid ($HF_{(aq)}$).

14. The process as claimed in claim 1, wherein the method used for etching the mask layer is wet etching.

15. The process as claimed in claim 14, wherein the etchant in the wet etching is a solution of hot phosphonic acid ($H_3PO_{4(aq)}$).

* * * * *

UNITED STATES PATENT AND TRADEMARK OFFICE
CERTIFICATE OF CORRECTION

PATENT NO. : 6,900,112 B2
DATED : May 31, 2005
INVENTOR(S) : Chi-Hui Lin et al.

It is certified that error appears in the above-identified patent and that said Letters Patent is hereby corrected as shown below:

<u>Title page,</u>
Insert Item -- [30] Foreign Application Priority Data
October 21, 2002 (TW) ... 91124261 --.

Signed and Sealed this

Thirtieth Day of August, 2005

JON W. DUDAS
*Director of the United States Patent and Trademark Office*